United States Patent
Oba et al.

(10) Patent No.: US 10,109,527 B2
(45) Date of Patent: Oct. 23, 2018

(54) OPTICAL DEVICE WAFER PROCESSING METHOD

(71) Applicant: DISCO CORPORATION, Tokyo (JP)

(72) Inventors: Ryugo Oba, Tokyo (JP); Takumi Shotokuji, Tokyo (JP); Naotoshi Kirihara, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 42 days.

(21) Appl. No.: 15/281,404

(22) Filed: Sep. 30, 2016

(65) Prior Publication Data

US 2017/0098579 A1    Apr. 6, 2017

(30) Foreign Application Priority Data

Oct. 6, 2015 (JP) ................. 2015-198571

(51) Int. Cl.
| | |
|---|---|
| *H01L 21/78* | (2006.01) |
| *H01L 21/268* | (2006.01) |
| *H01L 21/683* | (2006.01) |
| *H01L 21/67* | (2006.01) |
| *H01L 33/00* | (2010.01) |
| *H01S 5/00* | (2006.01) |

(Continued)

(52) U.S. Cl.
CPC ............ *H01L 21/78* (2013.01); *H01L 21/268* (2013.01); *H01L 21/67092* (2013.01); *H01L 21/6836* (2013.01); *H01L 33/00* (2013.01); *H01S 5/00* (2013.01); *B23K 26/0057* (2013.01); *B23K 26/40* (2013.01); *H01L 2933/0033* (2013.01)

(58) Field of Classification Search
CPC ................. H01L 21/78; H01L 21/6836; H01L 21/67092; H01L 21/268; B23K 26/0057; B23K 26/40
See application file for complete search history.

(56) References Cited

U.S. PATENT DOCUMENTS

| | | | |
|---|---|---|---|
| 8,110,423 B2 * | 2/2012 | Okabe ................. | H01L 33/0095 257/E21.214 |
| 9,130,057 B1 * | 9/2015 | Kumar .............. | H01L 21/67092 |
| (Continued) | | | |

FOREIGN PATENT DOCUMENTS

| | | |
|---|---|---|
| JP | 10-305420 | 11/1998 |
| JP | 2002-192370 | 7/2002 |
| JP | 2014-221483 | 11/2014 |

*Primary Examiner* — Marvin Payen
*Assistant Examiner* — Jeremy Joy
(74) *Attorney, Agent, or Firm* — Greer Burns & Crain, Ltd.

(57) ABSTRACT

An optical device wafer processing method includes a shield tunnel forming step of applying a pulsed laser beam having a transmission wavelength to a sapphire substrate along an area corresponding to each division line from the back side of the sapphire substrate in the condition where the focal point of the pulsed laser beam is set inside the sapphire substrate, thereby forming a plurality of shield tunnels arranged along the area corresponding to each division line, each shield tunnel being composed of a fine hole and an amorphous region formed around the fine hole for shielding the fine hole. The optical device wafer processing method further includes a dividing step of applying an external force to the optical device wafer after performing a light emitting layer forming step, thereby dividing the optical device wafer along the division lines to obtain the individual optical device chips.

6 Claims, 9 Drawing Sheets

(51) Int. Cl.
*B23K 26/00* (2014.01)
*B23K 26/40* (2014.01)

(56) References Cited

U.S. PATENT DOCUMENTS

| | | | | |
|---|---|---|---|---|
| 9,165,832 B1* | 10/2015 | Papanu | ................ | H01L 21/78 |
| 9,676,167 B2* | 6/2017 | Marjanovic | ......... | C03B 33/0222 |
| 2004/0002199 A1* | 1/2004 | Fukuyo | ............. | B23K 26/0057 |
| | | | | 438/460 |
| 2004/0112880 A1* | 6/2004 | Sekiya | ................ | B23K 26/032 |
| | | | | 219/121.69 |
| 2005/0186760 A1* | 8/2005 | Hashimura | ............ | B23K 26/18 |
| | | | | 438/460 |
| 2005/0199592 A1* | 9/2005 | Iri | ..................... | B23K 26/0057 |
| | | | | 219/121.6 |
| 2005/0272223 A1* | 12/2005 | Fujii | ................ | B23K 26/0057 |
| | | | | 438/459 |
| 2005/0277270 A1* | 12/2005 | Yoshikawa | ........... | B23K 26/16 |
| | | | | 438/463 |
| 2006/0105544 A1* | 5/2006 | Takanashi | ................ | C09D 5/32 |
| | | | | 438/460 |
| 2006/0148211 A1* | 7/2006 | Iwasaki | ............ | H01L 21/67092 |
| | | | | 438/462 |
| 2006/0216911 A1* | 9/2006 | Yoshikawa | ............ | B23K 26/40 |
| | | | | 438/460 |
| 2006/0220183 A1* | 10/2006 | Asai | ................. | H01L 21/67132 |
| | | | | 257/622 |
| 2007/0085099 A1* | 4/2007 | Fukumitsu | ......... | B23K 26/0884 |
| | | | | 257/98 |
| 2007/0111477 A1* | 5/2007 | Maruyama | ......... | B23K 26/0057 |
| | | | | 438/460 |
| 2007/0158314 A1* | 7/2007 | Fukumitsu | ............. | B28D 1/221 |
| | | | | 219/121.6 |
| 2009/0079073 A1* | 3/2009 | Mizusawa | ........... | H01L 23/3114 |
| | | | | 257/738 |
| 2009/0124063 A1* | 5/2009 | Nakamura | ........... | B23K 26/009 |
| | | | | 438/463 |
| 2009/0283127 A1* | 11/2009 | Juso | ........................ | H01L 31/18 |
| | | | | 136/244 |
| 2009/0298263 A1* | 12/2009 | Watanabe | .......... | B23K 26/0057 |
| | | | | 438/463 |
| 2009/0302428 A1* | 12/2009 | Sakamoto | .......... | B23K 26/0057 |
| | | | | 257/620 |
| 2011/0159621 A1* | 6/2011 | Endo | .................. | B23K 26/0057 |
| | | | | 438/34 |
| 2012/0111495 A1* | 5/2012 | Shimoi | ............... | B23K 26/0057 |
| | | | | 156/250 |
| 2012/0261678 A1* | 10/2012 | Hiraiwa | .......... | B23K 26/0057 |
| | | | | 257/79 |
| 2012/0329246 A1* | 12/2012 | Finn | ........................ | H01L 21/78 |
| | | | | 438/462 |
| 2013/0337633 A1* | 12/2013 | Seddon | .................. | H01L 21/78 |
| | | | | 438/462 |
| 2014/0213040 A1* | 7/2014 | Morikazu | ............... | H01L 21/78 |
| | | | | 438/462 |
| 2014/0248757 A1* | 9/2014 | Morikazu | ............... | H01L 21/78 |
| | | | | 438/463 |
| 2014/0334511 A1* | 11/2014 | Takeda | ..................... | H01S 3/10 |
| | | | | 372/41 |
| 2015/0165548 A1* | 6/2015 | Marjanovic | .......... | B23K 26/083 |
| | | | | 428/43 |
| 2015/0165562 A1* | 6/2015 | Marjanovic | ........ | C03B 33/0222 |
| | | | | 428/64.1 |

* cited by examiner

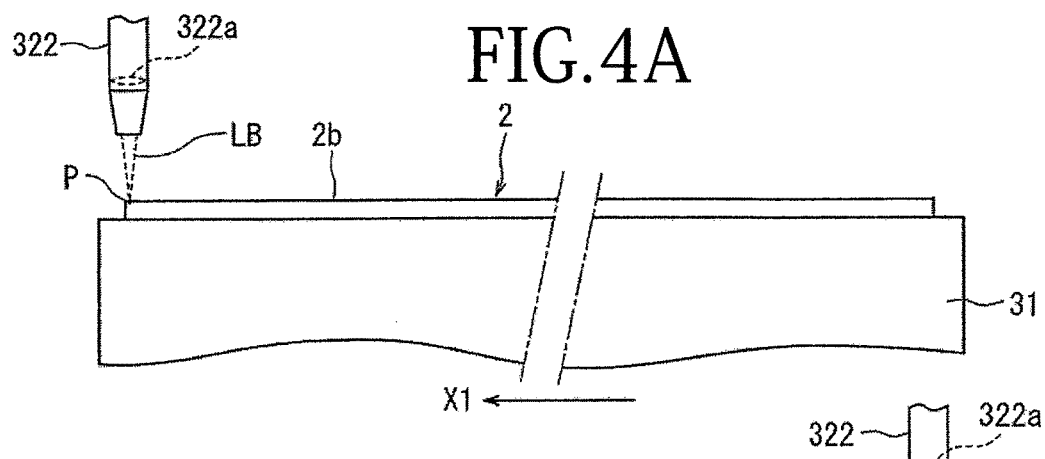
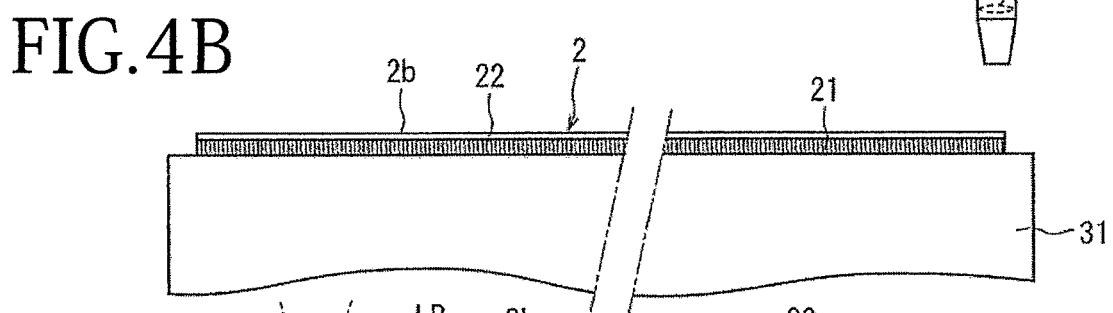
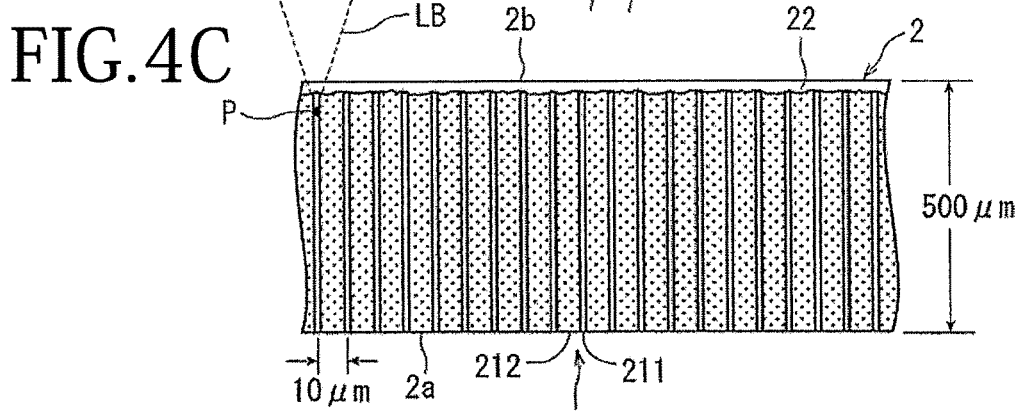
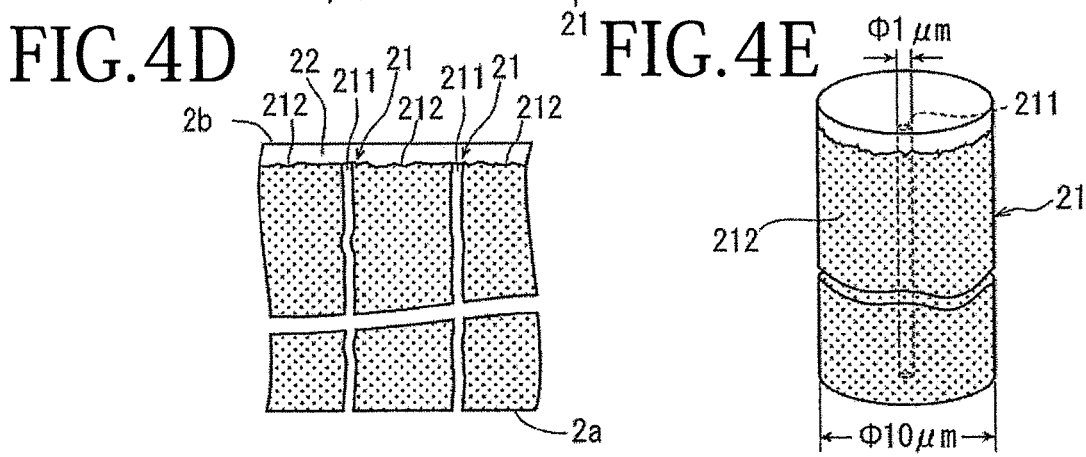

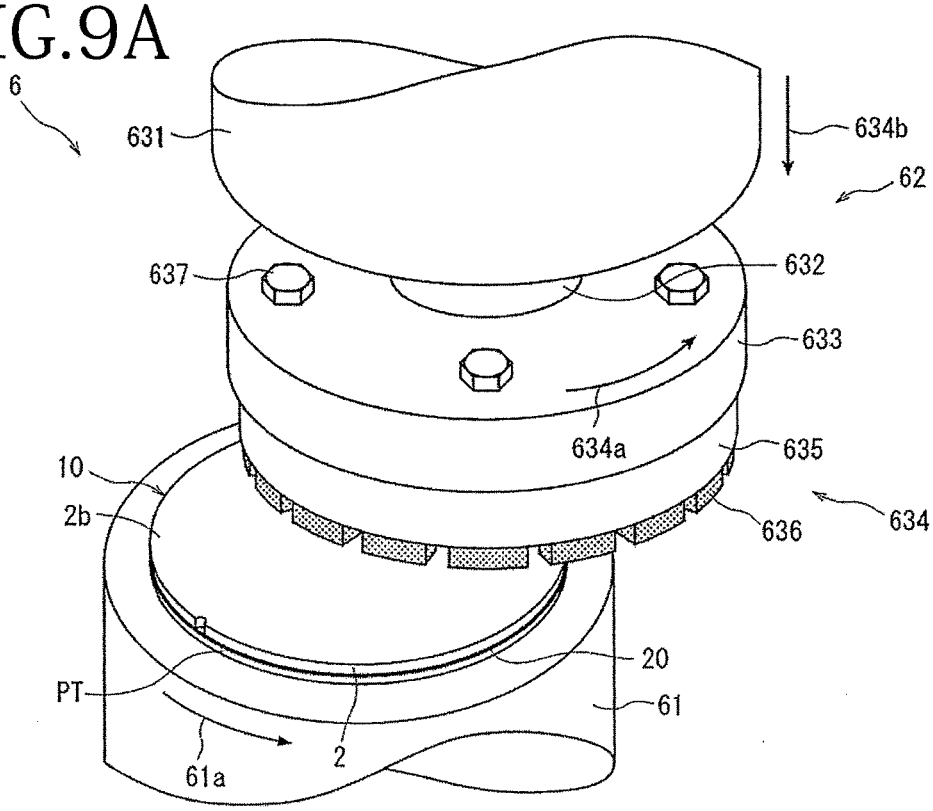
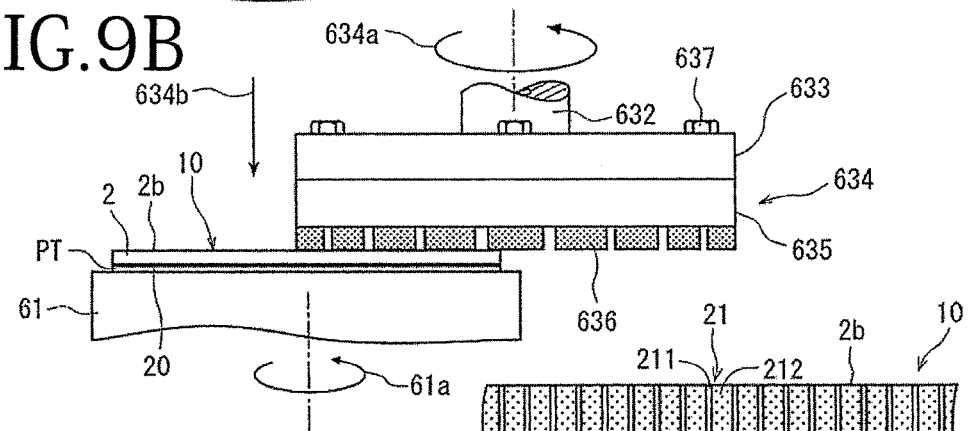
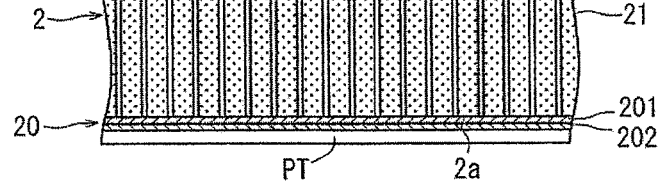

OPTICAL DEVICE WAFER PROCESSING METHOD

BACKGROUND OF THE INVENTION

Field of the Invention

The present invention relates to an optical device wafer processing method for dividing an optical device wafer into individual optical device chips along a plurality of crossing division lines, the optical device wafer being composed of a sapphire substrate and a light emitting layer formed on the front side of the sapphire substrate, the light emitting layer being partitioned by the division lines to define a plurality of separate regions where a plurality of optical devices are formed.

Description of the Related Art

In an optical device fabrication process, a light emitting layer (epitaxial layer) composed of an n-type gallium nitride semiconductor layer and a p-type gallium nitride semiconductor layer is formed on the front side of a substantially disk-shaped sapphire substrate. The light emitting layer is partitioned by a plurality of crossing division lines to define a plurality of separate regions where a plurality of optical devices such as light emitting diodes and laser diodes are formed, thus constituting an optical device wafer. The optical device wafer is cut along the division lines to thereby divide the plural separate regions where the optical devices are formed from each other, thus obtaining individual optical device chips corresponding to the optical devices.

Cutting of the optical device wafer along the division lines is usually performed by using a cutting apparatus called a dicing saw. This cutting apparatus includes a chuck table for holding a workpiece, cutting means for cutting the workpiece held on the chuck table, and feeding means for relatively moving the chuck table and the cutting means. The cutting means includes a spindle, a cutting blade mounted on the spindle, and a drive mechanism for rotationally driving the spindle. The cutting blade is composed of a circular base and an annular cutting edge mounted on one side of the circular base along the outer circumference thereof. The cutting edge is formed by performing electroforming to bond diamond abrasive grains having a grain size of approximately 3 µm, for example, to the base. The cutting edge has a thickness of approximately 20 µm.

However, since the sapphire substrate constituting the optical device wafer has high Mohs hardness, cutting of the sapphire substrate by the cutting blade is not always easy. Further, since the cutting edge of the cutting blade has a thickness of approximately 20 µm, each division line separating the devices from each other must have a width of approximately 50 µm. As a result, the ratio of the area of all the division lines to the area of the front side of the optical device wafer is increased to cause a reduction in productivity.

As a method of dividing the optical device wafer along the division lines to solve the above problem, there has been proposed a method including the steps of applying a pulsed laser beam having an absorption wavelength to the sapphire substrate along the division lines to thereby form a laser processed groove along each division line by ablation and next applying an external force to the wafer along each division line where the laser processed groove is formed as a break start point, thereby breaking the wafer along each division line (see Japanese Patent Laid-Open No. 1998-305420, for example).

However, when the laser beam is applied along each division line formed on the front side of the sapphire substrate constituting the optical device wafer to thereby form the laser processed groove, the periphery of each optical device such as a light emitting diode may be ablated to produce a fused material called debris, which adheres to the optical devices, causing a reduction in quality of each optical device.

There has been disclosed in Japanese Patent No. 3408805 a processing method for solving the above problem. This processing method includes the steps of applying a laser beam having a transmission wavelength to the sapphire substrate along the division lines from the back side of the sapphire substrate where the light emitting layer (epitaxial layer) is not formed, in the condition where the focal point of the laser beam is set inside the sapphire substrate, thereby forming a modified layer inside the sapphire substrate along each division line, and next dividing the sapphire substrate along each division line where the modified layer is formed to be reduced in strength.

However, when the modified layer is formed inside the sapphire substrate along each division line, the periphery of each optical device is surrounded by the modified layer to cause a reduction in die strength of each optical device. Furthermore, the sapphire substrate cannot be vertically divided from the back side to the front side.

There has been disclosed in Japanese Patent Laid-Open No. 2014-221483 a laser processing method for solving the above problem. This laser processing method includes the steps of setting the numerical aperture (NA) of a focusing lens for focusing a pulsed laser beam so that the value obtained by dividing the numerical aperture (NA) of the focusing lens by the refractive index (N) of a single crystal substrate falls within the range of 0.05 to 0.2, and next applying the pulsed laser beam focused by the focusing lens to the single crystal substrate in the condition where the focal point of the pulsed laser beam is set near one side of the single crystal substrate, thereby forming a shield tunnel extending (grown) between the focal point and the other side of the single crystal substrate where the pulsed laser beam has entered, wherein the shield tunnel is composed of a fine hole and an amorphous region formed around the fine hole for shielding the fine hole.

SUMMARY OF THE INVENTION

By using the laser processing method described in Japanese Patent Laid-Open No. 2014-221483 to perform laser processing to an optical device wafer having a sapphire substrate along each division line, a plurality of shield tunnels extending from the back side of the sapphire substrate to the front side thereof can be formed along each division line, each shield tunnel being composed of a fine hole and an amorphous region formed around the fine hole for shielding the fine hole. Accordingly, the optical device wafer can be vertically divided along each division line. Furthermore, a reduction in quality and die strength of each optical device due to scattering of debris can be prevented.

However, there is a problem such that the light emitting layer (epitaxial layer) formed on the front side of the sapphire substrate (the light emitting layer being composed of an n-type gallium nitride semiconductor layer and a p-type gallium nitride semiconductor layer) may be damaged by the shield tunnels extending from the back side of the sapphire substrate to the front side thereof, causing a reduction in luminance of each optical device.

It is therefore an object of the present invention to provide an optical device wafer processing method which can divide an optical device wafer into individual optical device chips without causing damage to the light emitting layer formed on the front side of the sapphire substrate.

In accordance with an aspect of the present invention, there is provided an optical device wafer processing method for dividing an optical device wafer into individual optical device chips along a plurality of crossing division lines, the optical device wafer being composed of a sapphire substrate and a light emitting layer formed on the front side of the sapphire substrate, the light emitting layer being partitioned by the division lines to define a plurality of separate regions where a plurality of optical devices are formed, the optical device wafer processing method including a shield tunnel forming step of applying a pulsed laser beam having a transmission wavelength to the sapphire substrate along an area corresponding to each division line from the back side of the sapphire substrate in the condition where the focal point of the pulsed laser beam is set inside the sapphire substrate, thereby forming a plurality of shield tunnels arranged along the area corresponding to each division line, each shield tunnel being composed of a fine hole and an amorphous region formed around the fine hole for shielding the fine hole; a light emitting layer forming step of forming the light emitting layer on the front side of the sapphire substrate after performing the shield tunnel forming step, thereby obtaining the optical device wafer; and a dividing step of applying an external force to the optical device wafer after performing the light emitting layer forming step, thereby dividing the optical device wafer along the division lines to obtain the individual optical device chips corresponding to the optical devices.

Preferably, each shield tunnel is formed in the condition where an unprocessed area having a predetermined thickness is left on the back side of the sapphire substrate in the shield tunnel forming step; and the optical device wafer processing method further includes an unprocessed area removing step of removing the unprocessed area after performing the light emitting layer forming step and before performing the dividing step.

In the optical device wafer processing method according to the present invention, the shield tunnel forming step is first performed to apply a pulsed laser beam having a transmission wavelength to the sapphire substrate from the back side thereof along the area corresponding to each division line in the condition where the focal point of the pulsed laser beam is set inside the sapphire substrate, thereby forming the plural shield tunnels arranged along the area corresponding to each division line, each shield tunnel being composed of the fine hole and the amorphous region formed around the fine hole for shielding the fine hole. After performing the shield tunnel forming step, the light emitting layer forming step is performed to form the light emitting layer on the front side of the sapphire substrate, thereby forming the optical device wafer composed of the sapphire substrate and the light emitting layer. Accordingly, it is possible to solve the problem that the light emitting layer may be damaged by the formation of the shield tunnels to cause a reduction in luminance of each optical device.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIGS. 4A to 4E are views for illustrating a second preferred embodiment of the shield tunnel forming step;
FIGS. 9A to 9C are views for illustrating an unprocessed area removing step.

DETAILED DESCRIPTION OF THE PREFERRED EMBODIMENT

Figure 1:
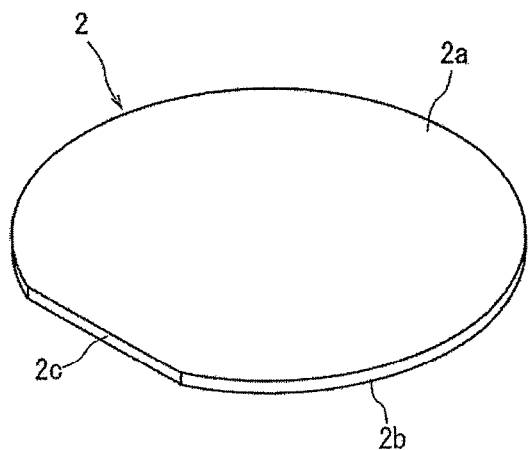
FIG. 1 is a perspective view of a sapphire substrate.

The optical device wafer processing method according to the present invention will now be described in more detail with reference to the attached drawings. FIG. 1 is a perspective view of a sapphire substrate 2 forming an optical device wafer. The sapphire ($Al_2O_3$) substrate 2 shown in FIG. 1 has a thickness of 500 µm, for example. The sapphire substrate 2 has a front side 2a and a back side 2b parallel to each other. The outer circumference of the sapphire substrate 2 is formed with an orientation flat 2c indicating a crystal orientation.

In performing the optical device wafer processing method according to the present invention by using the sapphire substrate 2, a shield tunnel forming step is first performed in such a manner that a pulsed laser beam having a transmission wavelength to the sapphire substrate 2 is applied to the sapphire substrate 2 from the back side 2b thereof along an area corresponding to each division line to be hereinafter described in the condition where the focal point of the pulsed laser beam is set inside the sapphire substrate 2, thereby forming a plurality of shield tunnels arranged along the area corresponding to each division line, each shield tunnel being composed of a fine hole and an amorphous region formed around the fine hole for shielding the fine hole. This shield tunnel forming step is performed by using a laser processing apparatus 3 shown in FIG. 2. The laser processing apparatus 3 shown in FIG. 2 includes a chuck table 31 for holding a workpiece, laser beam applying means 32 for applying a laser beam to the workpiece held on the chuck table 31, and imaging means 33 for imaging the workpiece held on the chuck table 31. The chuck table 31 has an upper surface as a holding surface for holding the workpiece thereon under suction. The chuck table 31 is movable both in the feeding direction (X direction) shown by an arrow X in FIG. 2 by feeding means (not shown) and in the indexing direction (Y direction) shown by an arrow Y in FIG. 2 by indexing means (not shown).

The laser beam applying means 32 includes a cylindrical casing 321 extending in a substantially horizontal direction. Although not shown, the casing 321 contains pulsed laser beam oscillating means including a pulsed laser oscillator and repetition frequency setting means. The laser beam applying means 32 further includes focusing means 322 mounted on the front end of the casing 321. The focusing means 322 has a focusing lens 322a for focusing a pulsed laser beam oscillated by the pulsed laser beam oscillating means. The numerical aperture (NA) of the focusing lens 322a of the focusing means 322 is set in the following manner. That is, the numerical aperture (NA) of the focusing lens 322a is set so that the value obtained by dividing the numerical aperture (NA) of the focusing lens 322a by the refractive index of the sapphire ($Al_2O_3$) substrate falls within the range of 0.05 to 0.2. Since the refractive index of the sapphire ($Al_2O_3$) substrate is 1.7, the numerical aperture (NA) of the focusing lens 322a is set in the range of 0.085 to 0.34. The laser beam applying means 32 further includes focal position adjusting means (not shown) for adjusting the focal position of the pulsed laser beam to be focused by the focusing lens 322a of the focusing means 322.

The imaging means 33 is mounted on a front end portion of the casing 321 constituting the laser beam applying means 32. The imaging means 33 is provided by optical means including a microscope and a charge-coupled device (CCD) camera. An image signal output from the imaging means 33 is transmitted to control means (not shown).

A first preferred embodiment of the shield tunnel forming step using the laser processing apparatus 3 will now be described. First, the sapphire substrate 2 is placed on the chuck table 31 of the laser processing apparatus 3 shown in FIG. 2 in the condition where the front side 2a of the sapphire substrate 2 is in contact with the upper surface of the chuck table 31. Thereafter, suction means (not shown) is operated to hold the sapphire substrate 2 on the chuck table 31 under suction (sapphire substrate holding step). Accordingly, the back side 2b of the sapphire substrate 2 held on the chuck table 31 is oriented upward. Thereafter, the chuck table 31 holding the sapphire substrate 2 is moved to a position directly below the imaging means 33 by operating the feeding means (not shown).

In the condition where the chuck table 31 is positioned directly below the imaging means 33, the imaging means 33 and the control means (not shown) detect whether or not the orientation flat 2c is parallel to the feeding direction (X direction). If the orientation flat 2c is not parallel to the feeding direction (X direction), the chuck table 31 is suitably rotated to make the orientation flat 2c parallel to the feeding direction (X direction) (alignment step). By performing this alignment step, each division line extending in a first direction to be hereinafter described becomes parallel to the feeding direction (X direction).

Figure 3A:
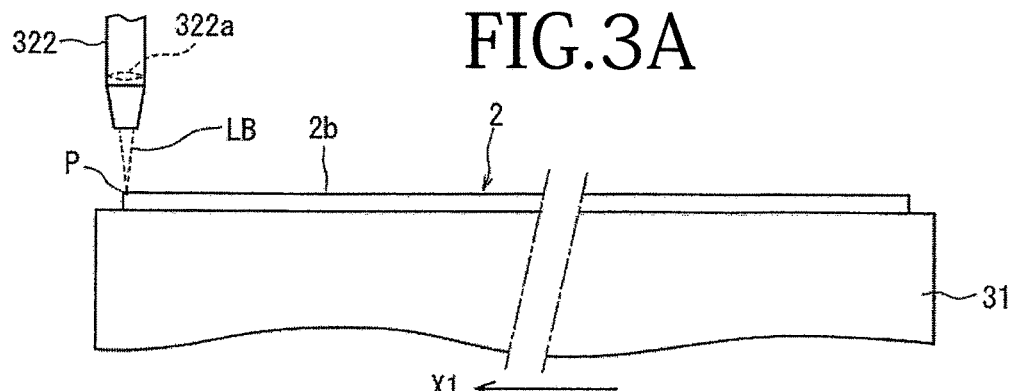
FIGS. 3A to 3E are views for illustrating a first preferred embodiment of the shield tunnel forming step.

After performing the alignment step mentioned above, the chuck table 31 is moved to a laser beam applying area where the focusing means 322 of the laser beam applying means 32 is located as shown in FIG. 3A, thereby positioning one end (left end as viewed in FIG. 3A) of the area corresponding to a predetermined one of division lines extending in the first direction directly below the focusing means 322, wherein the division lines are formed on a light emitting layer to be formed on the front side 2a of the sapphire substrate 2 as hereinafter described. Further, the focal position adjusting means (not shown) is operated to move the focusing means 322 in the direction along the optical axis of the focusing lens 322a so that the focal point P of a pulsed laser beam LB to be focused by the focusing lens 322a is set at a desired position from the back side 2b of the sapphire substrate 2 in the thickness direction thereof (focal position setting step). In this preferred embodiment, the focal point P of the pulsed laser beam is set at a desired position from the back side 2b of the sapphire substrate 2 (e.g., at a position below the back side 2b toward the front side 2a by a distance of 76 μm).

Figure 3B:
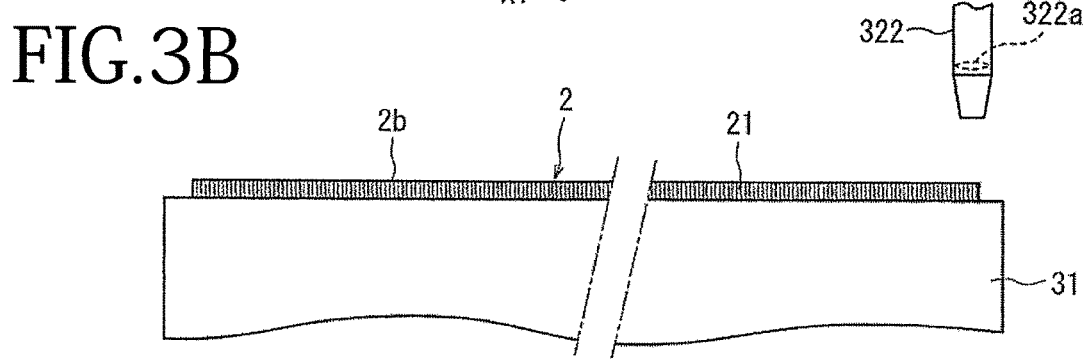

After performing the focal position setting step mentioned above, the pulsed laser beam applying means 32 is operated to apply the pulsed laser beam LB from the focusing means 322 to the sapphire substrate 2, thereby performing the shield tunnel forming step mentioned above so that each shield tunnel composed of the fine hole and the amorphous region extends from a position (back side 2b) near the focal point P to the front side 2a of the sapphire substrate 2. That is, the pulsed laser beam LB having a transmission wavelength to the sapphire substrate 2 is applied from the focusing means 322 to the sapphire substrate 2, and at the same time the chuck table 31 is moved at a predetermined feed speed in the direction shown by an arrow X1 in FIG. 3A (shield tunnel forming step). When the other end (right end as viewed in FIG. 3B) of the area corresponding to the predetermined division line reaches the position directly below the focusing means 322 as shown in FIG. 3B, the application of the pulsed laser beam LB is stopped and the movement of the chuck table 31 is also stopped.

For example, the shield tunnel forming step mentioned above is performed under the following processing conditions.

Wavelength: 1030 nm
Repetition frequency: 40 kHz
Pulse width: 10 ps
Average power: 0.5 W
Spot diameter: 5 μm
Work feed speed: 400 mm/second
Numerical aperture of the focusing lens: 0.25

Figure 3C:
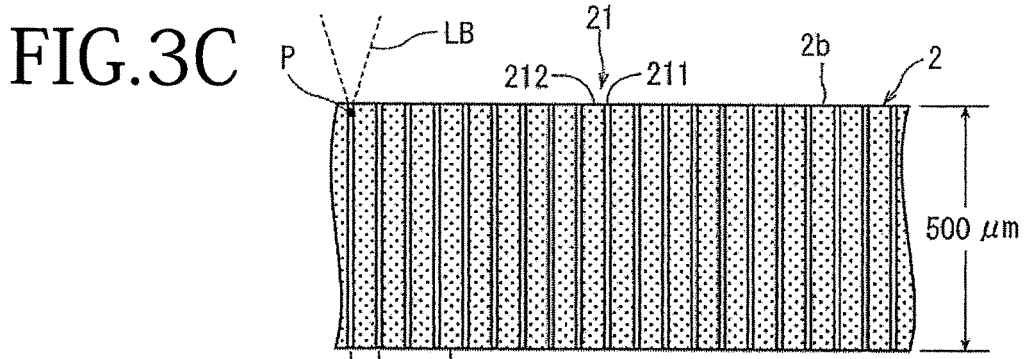
Figure 3D:
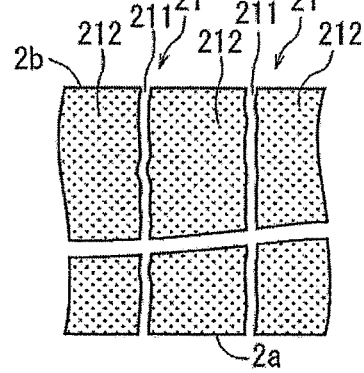
Figure 3E:
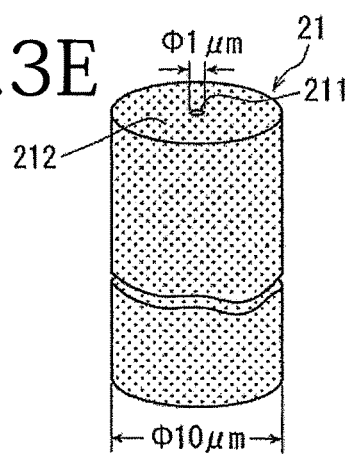

By performing the first preferred embodiment of the shield tunnel forming step mentioned above, a plurality of fine holes 211 and a plurality of amorphous regions 212 are grown in the sapphire substrate 2 so as to extend from the position (back side 2b) near the focal point P of the pulsed laser beam LB to the front side 2a of the sapphire substrate 2 as shown in FIG. 3C, wherein the amorphous regions 212 are formed around the fine holes 211. As a result, a plurality of amorphous shield tunnels 21 are formed along the area corresponding to the predetermined division line at predetermined intervals, e.g., 10 μm intervals (=(work feed speed: 400 mm/second)/(repetition frequency: 40 kHz)) as shown in FIG. 3C. As shown in FIGS. 3D and 3E, each shield tunnel 21 is composed of the central fine hole 211 having a diameter of approximately 1 μm and the amorphous region 212 formed around the central fine hole 211 and having a diameter of 10 μm. In this preferred embodiment, the amorphous regions 212 of any adjacent ones of the plural shield tunnels 21 are connected with each other.

Figure 2:
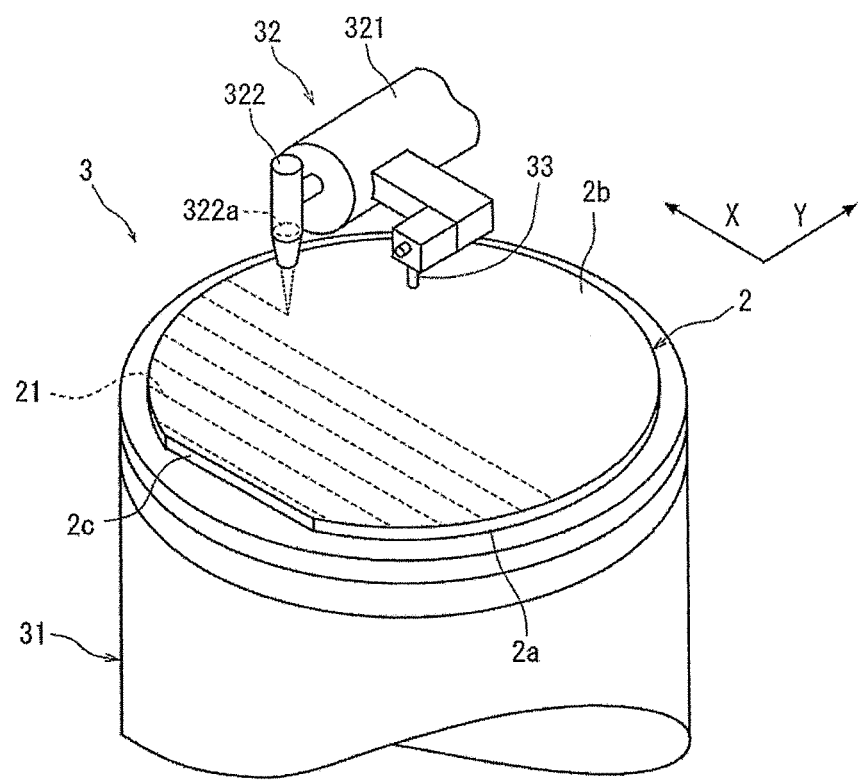
FIG. 2 is a perspective view of an essential part of a laser processing apparatus for performing a shield tunnel forming step.

After performing the shield tunnel forming step along the area corresponding to the predetermined division line as mentioned above, the chuck table 31 is moved in the indexing direction shown by the arrow Y in FIG. 2 by the pitch of the division lines to be hereinafter described (indexing step), and the shield tunnel forming step is similarly performed along the area corresponding to the next division line extending in the first direction. In this manner, the shield tunnel forming step is performed along the areas corresponding to all of the division lines extending in the first direction. Thereafter, the chuck table 31 is rotated 90 degrees to similarly perform the shield tunnel forming step along the areas corresponding to all of the other division lines extending in a second direction perpendicular to the first direction.

A second preferred embodiment of the shield tunnel forming step will now be described with reference to FIGS.

4A to 4E. After performing the alignment step mentioned above, one end (left end as viewed in FIG. 4A) of the area corresponding to a predetermined one of division lines extending in the first direction is positioned directly below the focusing means 322 as shown in FIG. 4A as similar to the first preferred embodiment shown in FIGS. 3A to 3E, wherein the division lines are formed on a light emitting layer to be formed on the front side of the sapphire substrate 2 as hereinafter described. Further, the focal point P of a pulsed laser beam LB to be focused by the focusing lens 322a of the focusing means 322 is set at a position below the back side 2b of the sapphire substrate 2 toward the front side 2a by a distance of 80 to 85 μm (focal position setting step).

After performing the focal position setting step mentioned above, the pulsed laser beam applying means 32 is operated to apply the pulsed laser beam LB from the focusing means 322 to the sapphire substrate 2, thereby performing the shield tunnel forming step mentioned above so that each shield tunnel composed of the fine hole and the amorphous region extends from a position near the focal point P to the front side 2a of the sapphire substrate 2. That is, as similar to the first preferred embodiment shown in FIGS. 3A to 3E, the pulsed laser beam LB having a transmission wavelength to the sapphire substrate 2 is applied from the focusing means 322 to the sapphire substrate 2, and at the same time the chuck table 31 is moved at a predetermined feed speed in the direction shown by an arrow X1 in FIG. 4A (shield tunnel forming step). When the other end (right end as viewed in FIG. 4B) of the area corresponding to the predetermined division line reaches the position directly below the focusing means 322 as shown in FIG. 4B, the application of the pulsed laser beam LB is stopped and the movement of the chuck table 31 is also stopped. The processing conditions in the second preferred embodiment of the shield tunnel forming step may be similar to those in the first preferred embodiment.

By performing the second preferred embodiment of the shield tunnel forming step mentioned above, a plurality of fine holes 211 and a plurality of amorphous regions 212 are grown in the sapphire substrate 2 so as to extend from the position near the focal point P of the pulsed laser beam LB to the front side 2a (lower surface) as shown in FIG. 4C, wherein the amorphous regions 212 are formed around the fine holes 211. As a result, a plurality of amorphous shield tunnels 21 are formed along the area corresponding to the predetermined division line at predetermined intervals, e.g., 10 μm intervals as shown in FIG. 4C. As shown in FIGS. 4D and 4E, each shield tunnel 21 is composed of the central fine hole 211 having a diameter of approximately 1 μm and the amorphous region 212 formed around the central fine hole 211 and having a diameter of 10 μm. In this preferred embodiment, the amorphous regions 212 of any adjacent ones of the plural shield tunnels 21 are connected with each other. Unlike the first preferred embodiment shown in FIGS. 3A to 3E, the focal point P of the pulsed laser beam LB is set at the position below the back side 2b (upper surface) of the sapphire substrate 2 as a beam entrance side toward the front side 2a (lower surface) by a distance of 80 to 85 μm as described above in the second preferred embodiment shown in FIGS. 4A to 4E. Accordingly, each shield tunnel 21 is formed in the condition where an unprocessed area 22 having a thickness of 5 to 10 μm is left on the back side 2b of the sapphire substrate 2. The second preferred embodiment of the shield tunnel forming step mentioned above is similarly performed along the areas corresponding to all of the other division lines of the light emitting layer to be formed on the front side 2a of the sapphire substrate 2.

After performing the shield tunnel forming step, a light emitting layer forming step is performed in such a manner that a light emitting layer is formed on the front side 2a of the sapphire substrate 2 to thereby obtain an optical device wafer. This light emitting layer forming step is performed by an epitaxial growth method known in the art.

Figure 5A:
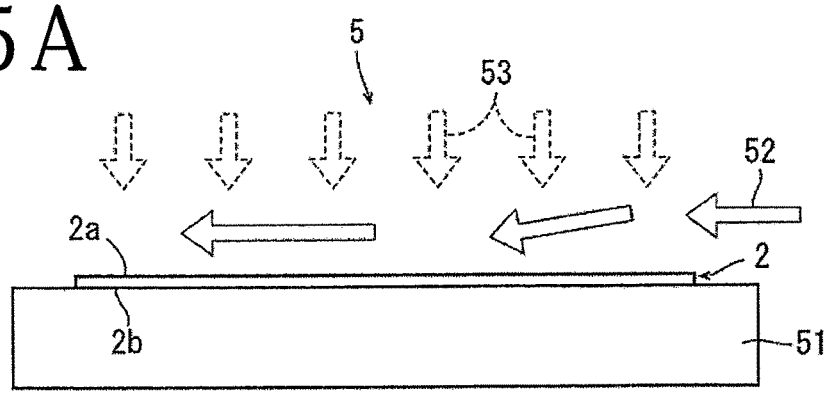
FIGS. 5A to 5C are views for illustrating a light emitting layer forming step.
Figure 5B:
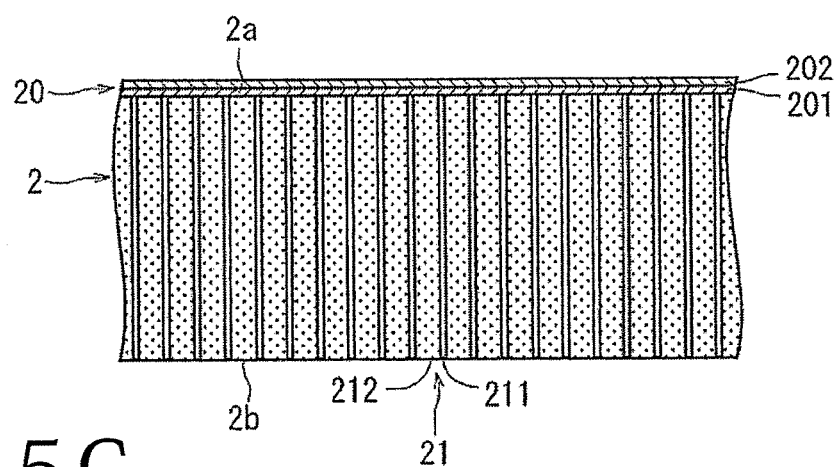
Figure 5C:
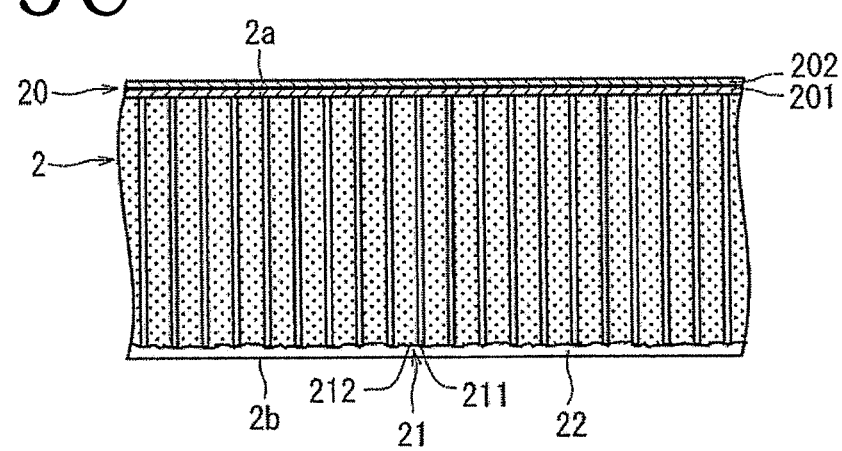

As shown in FIG. 5A, the sapphire substrate 2 processed by the shield tunnel forming step is placed on a substrate support table 51 of an epitaxial growth apparatus 5 in the condition where the back side 2b of the sapphire substrate 2 is in contact with the upper surface of the substrate support table 51, i.e., the front side 2a of the sapphire substrate 2 is oriented upward. Thereafter, a source gas 52 such as trimethyl gallium and $NH_3$ is horizontally passed over the front side 2a of the sapphire substrate 2. At the same time, an inert gas 53 such as $H_2$ and $N_2$ is vertically passed toward the front side 2a of the sapphire substrate 2, so as to push the source gas 52 against the front side 2a of the sapphire substrate 2. As a result, a GaN film is grown on the front side 2a of the sapphire substrate 2. That is, as shown in FIG. 5B or FIG. 5C, a light emitting layer 20 composed of an n-type gallium nitride semiconductor layer 201 and a p-type gallium nitride semiconductor layer 202 is formed on the front side 2a of the sapphire substrate 2. The light emitting layer 20 has a thickness of 10 μm, for example. FIG. 5B shows a case that the light emitting layer 20 is formed on the front side 2a of the sapphire substrate 2 processed by the first preferred embodiment of the shield tunnel forming step, whereas FIG. 5C shows a case that the light emitting layer 20 is formed on the front side 2a of the sapphire substrate 2 processed by the second preferred embodiment of the shield tunnel forming step. In the case that the shield tunnels 21 extend from the back side 2b to the front side 2a of the sapphire substrate 2 as shown in FIG. 5B, there is a possibility that the sapphire substrate 2 may be broken along the shield tunnels 21 in performing the light emitting layer forming step. To the contrary, in the case that the unprocessed area 22 is formed on the back side 2b of the sapphire substrate 2 as shown in FIG. 5C, the rigidity of the sapphire substrate 2 can be increased by the unprocessed area 22 to thereby eliminate the possibility of breakage of the sapphire substrate 2.

Figure 6A:
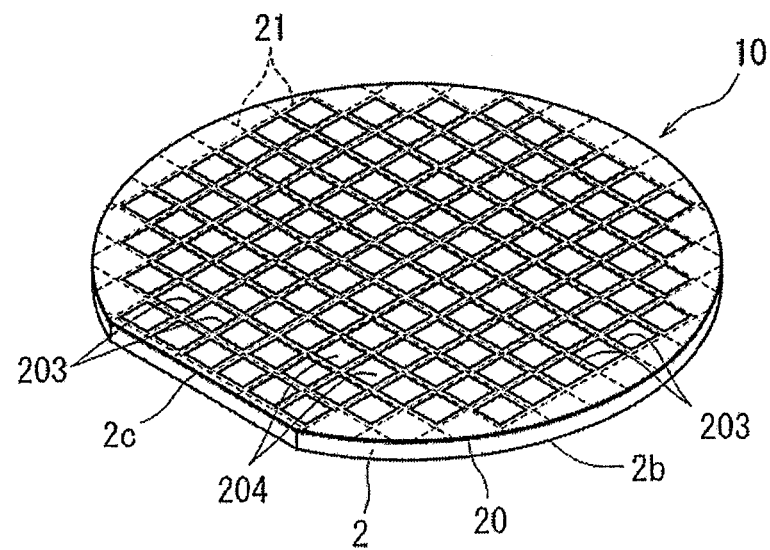
FIG. 6A is a perspective view of an optical device wafer formed by performing the light emitting layer forming step.
Figure 6B:
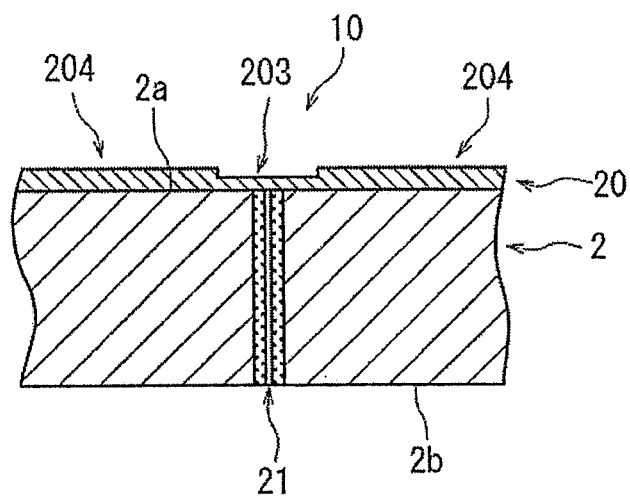
FIG. 6B is an enlarged sectional view of an essential part of the optical device wafer shown in FIG. 6A.

By performing the light emitting layer forming step of forming the light emitting layer 20 on the front side 2a of the sapphire substrate 2, an optical device wafer 10 shown in FIGS. 6A and 6B is obtained. The light emitting layer 20 constituting the optical device wafer 10 shown in FIGS. 6A and 6B is partitioned by a plurality of crossing division lines 203 to thereby define a plurality of separate regions where a plurality of optical devices 204 are formed. The sapphire substrate 2 constituting the optical device wafer 10 includes the shield tunnels 21 formed along the area corresponding to each division line 203 in the shield tunnel forming step.

Figure 7:
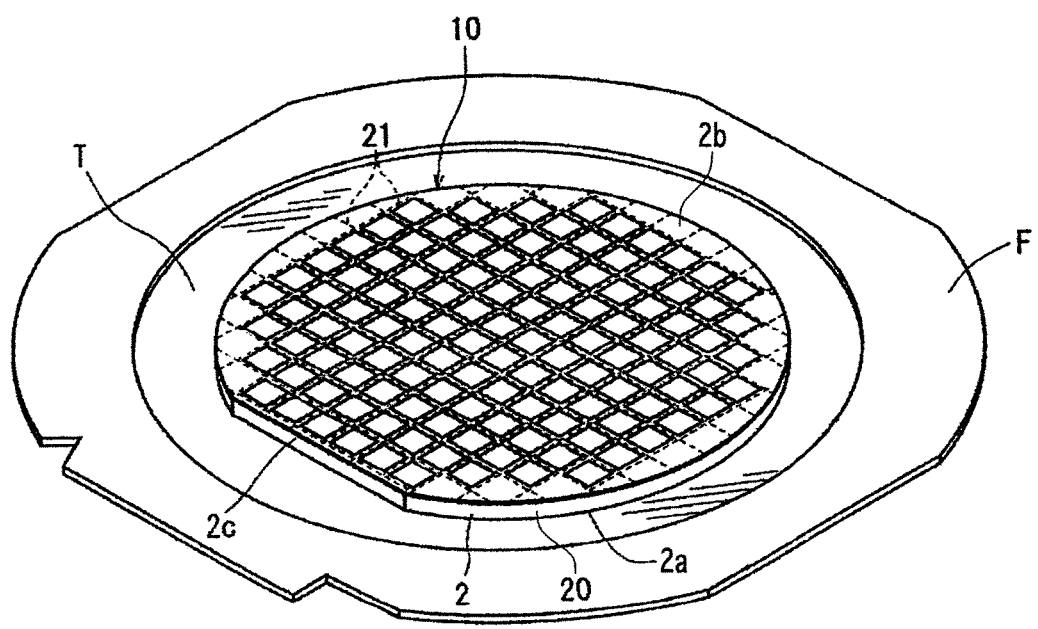
FIG. 7 is a perspective view showing a condition that the optical device wafer shown in FIG. 6A is attached to a dicing tape supported to an annular frame.

After performing the light emitting layer forming step mentioned above, a wafer supporting step is performed in such a manner that the optical device wafer 10 is attached to a dicing tape supported to an annular frame. More specifically, as shown in FIG. 7, a dicing tape T is supported at its peripheral portion to an annular frame F so as to close the inner opening of the annular frame F, and the light emitting layer 20 formed on the front side 2a of the sapphire substrate 2 constituting the optical device wafer 10 is attached to the dicing tape T supported to the annular frame F. Accordingly, the back side 2b of the sapphire substrate 2 of the optical device wafer 10 attached to the dicing tape T is oriented upward, or exposed.

Figure 8A:
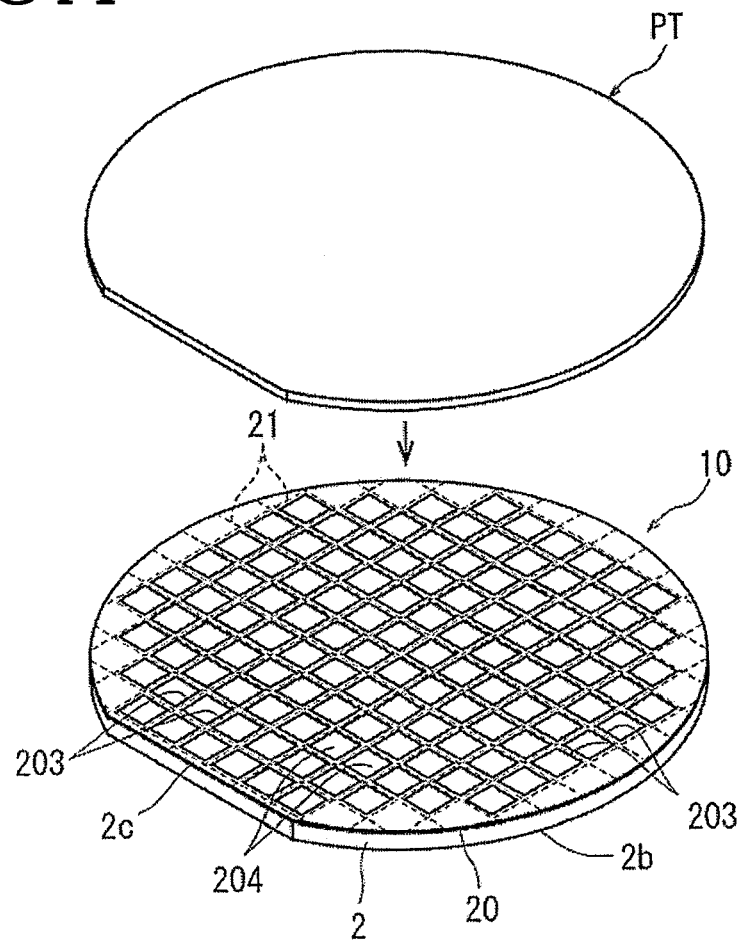
FIGS. 8A and 8B are perspective views for illustrating a protective member attaching step.
Figure 8B:
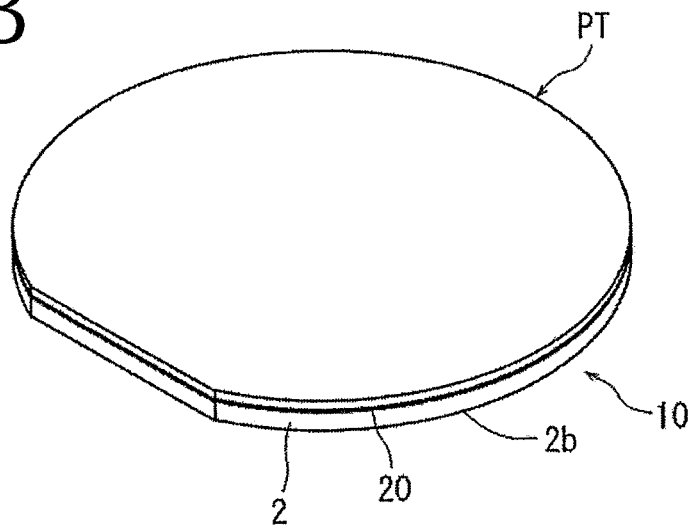

In the case that the optical device wafer 10 includes the sapphire substrate 2 processed by the second preferred embodiment of the shield tunnel forming step, thereby forming the unprocessed area 22 on the back side 2b of the sapphire substrate 2, an unprocessed area removing step of removing the unprocessed area 22 is performed before performing the wafer supporting step. In performing the unprocessed area removing step, a protective member attaching step is first performed in such a manner that a protective member is attached to the front side of the light emitting layer 20, so as to protect the light emitting layer 20. More specifically, as shown in FIGS. 8A and 8B, a protective tape PT as the protective member is attached to the front side of the light emitting layer 20 formed on the front side 2a of the sapphire substrate 2 constituting the optical device wafer 10. The protective tape PT is composed of a base sheet and an adhesive layer formed on the base sheet. For example, the base sheet is formed of polyvinyl chloride (PVC) and has a thickness of 100 μm. The adhesive layer is formed of acrylic resin and has a thickness of approximately 5 μm.

After performing the protective member attaching step, the unprocessed area removing step is performed to remove the unprocessed area 22 from the back side 2b of the sapphire substrate 2 constituting the optical device wafer 10. This unprocessed area removing step is performed by using a grinding apparatus 6 shown in FIG. 9A. The grinding apparatus 6 shown in FIG. 9A includes a chuck table 61 as holding means for holding a workpiece and grinding means 62 for grinding the workpiece held on the chuck table 61. The chuck table 61 has an upper surface as a holding surface for holding the workpiece under suction. The chuck table 61 is rotatable in the direction shown by an arrow 61a in FIG. 9A by a rotational drive mechanism (not shown). The grinding means 62 includes a spindle housing 631, a spindle 632 rotatably supported to the spindle housing 631 and adapted to be rotated by a rotational drive mechanism (not shown), a mounter 633 fixed to the lower end of the spindle 632, and a grinding wheel 634 mounted on the lower surface of the mounter 633. The grinding wheel 634 is composed of an annular base 635 and a plurality of abrasive members 636 fixed to the lower surface of the annular base 635 so as to be annularly arranged along the outer circumference thereof. The annular base 635 is mounted on the lower surface of the mounter 633 by a plurality of fastening bolts 637.

In performing the unprocessed area removing step by using the grinding apparatus 6 mentioned above, the optical device wafer 10 is placed on the chuck table 61 in the condition where the protective tape PT attached to the front side of the light emitting layer 20 constituting the optical device wafer 10 is in contact with the upper surface (holding surface) of the chuck table 61 as shown in FIG. 9A. Thereafter, suction means (not shown) is operated to hold the optical device wafer 10 through the protective tape PT on the chuck table 61 under suction (wafer holding step). Accordingly, the optical device wafer 10 is held through the protective tape PT on the chuck table 61 under suction in the condition where the back side 2b of the sapphire substrate 2 constituting the optical device wafer 10 is oriented upward. After holding the optical device wafer 10 through the protective tape PT on the chuck table 61 under suction as mentioned above, the chuck table 61 is rotated in the direction of the arrow 61a in FIG. 9A at 300 rpm, for example. At the same time, the grinding wheel 634 of the grinding means 62 is also rotated in the direction shown by an arrow 634a in FIG. 9A at 6000 rpm, for example. Thereafter, the grinding means 62 is lowered to bring the abrasive members 636 of the grinding wheel 634 into contact with the back side 2b (work surface) of the sapphire substrate 2 of the optical device wafer 10. Thereafter, the grinding wheel 634 is fed (lowered) in the direction shown by an arrow 634b in FIGS. 9A and 9B (in the direction perpendicular to the holding surface of the chuck table 61) by a predetermined amount at a feed speed of 1 μm/second, for example. As a result, the back side 2b of the sapphire substrate 2 is ground until the unprocessed area 22 is removed and the upper end of each shield tunnel 21 is exposed to the back side 2b of the sapphire substrate 2 as shown in FIG. 9C.

After performing the unprocessed area removing step as mentioned above, the protective tape PT as the protective member is peeled from the front side of the light emitting layer 20 formed on the front side 2a of the sapphire substrate 2 of the optical device wafer 10. Thereafter, the wafer supporting step mentioned above is performed as shown in FIG. 7. That is, the light emitting layer 20 formed on the front side 2a of the sapphire substrate 2 is attached to the dicing tape T supported to the annular frame F.

Figure 10A:
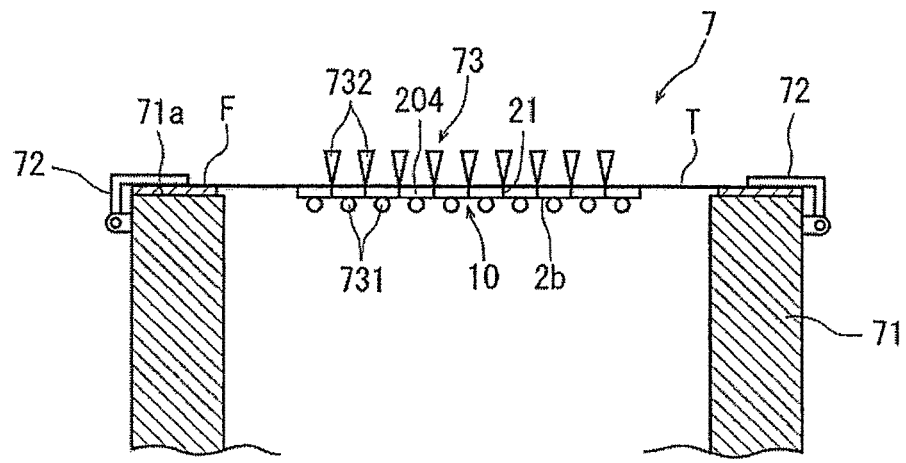
FIGS. 10A to 10C are sectional views for illustrating a dividing step.
Figure 10B:
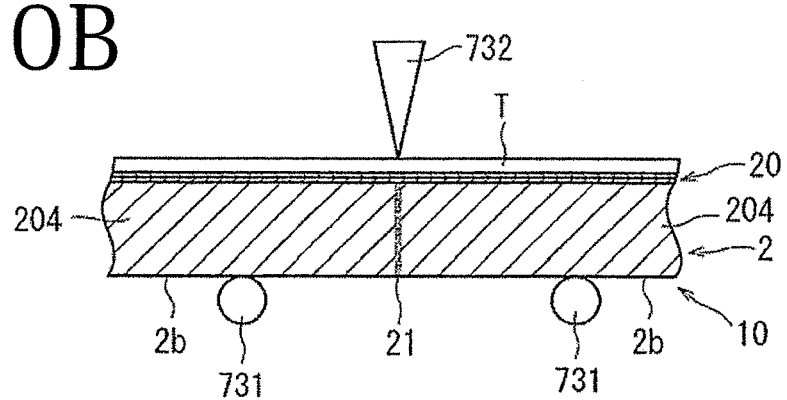
Figure 10C:
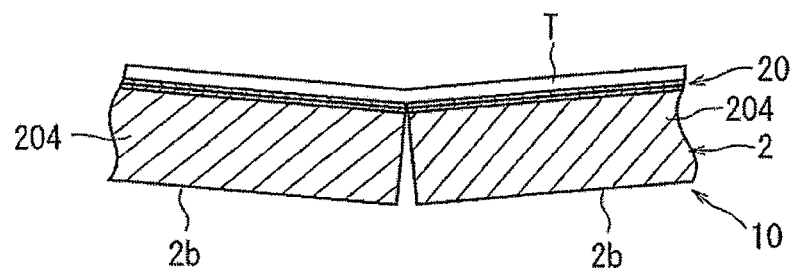

After performing the wafer supporting step, a dividing step is performed in such a manner that an external force is applied to the optical device wafer 10 to thereby divide the optical device wafer 10 along the division lines 203, thus obtaining the individual optical devices 204 as chips divided from each other. This dividing step is performed by using a dividing apparatus 7 shown in FIG. 10A. The dividing apparatus 7 includes a cylindrical base 71 having a mounting surface 71a for mounting the annular frame F, a plurality of clamps 72 provided on the outer circumference of the cylindrical base 71 for clamping the annular frame F, and bending load applying means 73 for applying a bending load to the optical device wafer 10. The bending load applying means 73 includes a plurality of rodlike parallel support members 731 for supporting the optical device wafer 10 and a plurality of wedge-shaped parallel pressing members 732 for pressing the optical device wafer 10. First, the annular frame F supporting the optical device wafer 10 through the dicing tape T is mounted on the mounting surface 71a of the cylindrical base 71 in the condition where the dicing tape T is oriented upward as shown in FIG. 10A. Further, the annular frame F is clamped by the clamps 72. In this condition, the back side 2b of the sapphire substrate 2 is oriented downward and mounted on the plural support members 731 of the bending load applying means 73 in such a manner that the line connecting the shield tunnels 21 formed in the area corresponding to each division line 203 extending in the first direction is positioned between any adjacent ones of the plural support members 731 as shown in FIG. 10B. Thereafter, the plural pressing members 732 are lowered to press the optical device wafer 10 from the upper side thereof, i.e., from the dicing tape T side along the division lines 203 extending in the first direction. As a result, a bending load is applied to the optical device wafer 10 along each division line 203 extending in the first direction, i.e., along the line connecting the shield tunnels 21 formed in the area corresponding to each division line 203 extending in the first direction, so that a tensile stress is generated in the sapphire substrate 2 at the shield tunnels 21 formed in the area corresponding to each division line 203 extending in the first direction. As a result, the optical device wafer 10 is divided along each division line 203 extending in the first direction, wherein the shield tunnels 21 formed in the area corresponding to each division line 203 function as a division start point as shown in FIG. 10C.

After dividing the optical device wafer 10 along each division line 203 extending in the first direction, the cylindrical base 71 is rotated 90 degrees to similarly divide the optical device wafer 10 along each division line 203 extending in the second direction perpendicular to the first direction. As a result, the optical device wafer 10 can be divided into the individual optical devices 204 as chips. These individual optical devices 204 divided from each other are maintained in the form of the optical device wafer 10 because the front side of each optical device 204 is attached to the dicing tape T.

As described above, the optical device wafer processing method includes the shield tunnel forming step of applying a pulsed laser beam having a transmission wavelength to the sapphire substrate 2 from the back side 2b thereof along the area corresponding to each division line 203 in the condition where the focal point of the pulsed laser beam is set inside the sapphire substrate 2, thereby forming the plural shield tunnels 21 arranged along the area corresponding to each division line 203, each shield tunnel 21 being composed of the fine hole 211 and the amorphous region 212 formed around the fine hole 211 for shielding the fine hole 211. After performing the shield tunnel forming step, the light emitting layer forming step is performed to form the light emitting layer 20 on the front side 2a of the sapphire substrate 2, thereby forming the optical device wafer 10 composed of the sapphire substrate 2 and the light emitting layer 20. Accordingly, it is possible to solve the problem that the light emitting layer 20 may be damaged by the formation of the shield tunnels 21 to cause a reduction in luminance of each optical device.

In the above preferred embodiment of the present invention, one side of the sapphire substrate 2 is defined as the front side 2a and the other side of the sapphire substrate 2 is defined as the back side 2b, wherein the pulsed laser beam is applied to the sapphire substrate 2 from the back side 2b as the other side to perform the shield tunnel forming step, and the light emitting layer 20 is next formed on the front side 2a of the sapphire substrate 2 as one side thereof. Alternatively, in the case that one side of the sapphire substrate 2 is defined as the back side 2b and the other side of the sapphire substrate 2 is defined as the front side 2a, the pulsed laser beam is applied to the sapphire substrate 2 from the back side 2b as one side to perform the shield tunnel forming step, and the light emitting layer 20 is next formed on the front side 2a of the sapphire substrate 2 as the other side.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. An optical device wafer processing method for dividing an optical device wafer into individual optical device chips along a plurality of crossing division lines, said optical device wafer being composed of a sapphire substrate and a light emitting layer formed on a front side of said sapphire substrate, said light emitting layer being partitioned by said division lines to define a plurality of separate regions where a plurality of optical devices are formed, said optical device wafer processing method comprising:

a shield tunnel forming step of applying a pulsed laser beam having a transmission wavelength to said sapphire substrate along an area corresponding to each division line from a back side of said sapphire substrate in a condition where the focal point of said pulsed laser beam is set inside said sapphire substrate, thereby forming a plurality of shield tunnels arranged along said area corresponding to each division line, each shield tunnel being composed of a fine hole and an amorphous region formed around said fine hole for shielding said fine hole;

a light emitting layer forming step of forming said light emitting layer on the front side of said sapphire substrate after performing said shield tunnel forming step, thereby obtaining said optical device wafer, wherein at least some portions of said light emitting layer are in contact with at least some of said shield tunnels; and a dividing step of applying an external force to said optical device wafer after performing said light emitting layer forming step, thereby dividing said optical device wafer along said division lines to obtain said individual optical device chips corresponding to said optical devices, wherein said dividing step of applying an external force includes applying a bending load to the optical device wafer;

wherein each shield tunnel is formed in a condition where an unprocessed area having a predetermined thickness is left on the back side of said sapphire substrate in said shield tunnel forming step; and said optical device wafer processing method further comprises an unprocessed area removing step of removing said unprocessed area after performing said light emitting layer forming step and before performing said dividing step.

2. The optical device wafer processing method according to claim 1, wherein said focal point of said pulsed laser beam is set at a position below the back side of said sapphire substrate toward the front side by a distance of between 80 to 85 μm, thereby resulting in said predetermined thickness of said unprocessed area being between 5 and 10 μm thick.

3. The optical device wafer processing method according to claim 1, wherein the bending load is applied to the optical device wafer via a bending load applying means that includes a plurality of rod-like parallel support members for supporting the optical device wafer and a plurality of pressing members for pressing the optical device wafer.

4. An optical device wafer processing method comprising:

a shield tunnel forming step of applying a laser beam having a transmission wavelength to a sapphire substrate having an orientation flat from a back side of the sapphire substrate in a condition where a focal point of the pulsed laser beam is set inside the sapphire substrate, the pulsed laser beam being applied parallel to the orientation flat, thereby forming a plurality of crossing shield tunnels in the sapphire substrate, each shield tunnel being composed of a fine hole and an amorphous region formed around said fine hole for shielding said fine hole;

a light emitting layer forming step of forming a light emitting layer on the front side of the sapphire substrate after performing said shield tunnel forming step, thereby obtaining said optical device wafer, the light emitting layer being partitioned by a plurality of crossing division lines formed corresponding to the crossing shield tunnels to define a plurality of separate regions where a plurality of optical devices are formed; and a dividing step of applying an external force to said optical device wafer after performing said light emitting layer forming step, thereby dividing said optical device wafer along the division lines to obtain individual optical device chips corresponding to said optical devices, wherein said dividing step of applying an external force includes applying a bending load to the optical device wafer;

wherein each shield tunnel is formed in a condition where an unprocessed area having a predetermined thickness is left on the back side of the sapphire substrate in said shield tunnel forming step; and said optical device wafer processing method further comprises an unprocessed area removing step of removing the unprocessed area after performing said light emitting layer forming step and before performing said dividing step.

5. The optical device wafer processing method according to claim 4, wherein said focal point of said pulsed laser beam is set at a position below the back side of said sapphire substrate toward the front side by a distance of between 80 to 85 μm, thereby resulting in said predetermined thickness of said unprocessed area being between 5 and 10 μm thick.

6. The optical device wafer processing method according to claim 4, wherein the bending load is applied to the optical device wafer via a bending load applying means that includes a plurality of rod-like parallel support members for supporting the optical device wafer and a plurality of pressing members for pressing the optical device wafer.

* * * * *